(12) United States Patent
Kuo et al.

(10) Patent No.: US 10,223,561 B1
(45) Date of Patent: Mar. 5, 2019

(54) BARCODE DECODING METHOD AND BARCODE READER

(71) Applicant: QISDA CORPORATION, Taoyuan (TW)

(72) Inventors: Jun-Hao Kuo, New Taipei (TW); Chieh-Ling Hsiao, Taipei (TW); Chia-Ching Tsai, New Taipei (TW); Hung-Chih Chan, Taipei (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 15/900,802

(22) Filed: Feb. 21, 2018

(30) Foreign Application Priority Data

Feb. 7, 2018 (CN) .......................... 2018 1 0122269

(51) Int. Cl.
*G06K 7/10* (2006.01)
*G06K 7/14* (2006.01)
*H03M 13/37* (2006.01)
*H03M 13/00* (2006.01)

(52) U.S. Cl.
CPC ....... *G06K 7/10722* (2013.01); *G06K 7/1413* (2013.01); *H03M 13/3753* (2013.01); *H03M 13/616* (2013.01)

(58) Field of Classification Search
CPC ............... G06K 7/14; G06K 19/06037; G06K 7/10722; G06K 7/1417
USPC .................................. 235/454, 462.01–462.49
See application file for complete search history.

(56) References Cited

U.S. PATENT DOCUMENTS

| | | | | |
|---|---|---|---|---|
| 4,745,269 A | * | 5/1988 | Van Gils | ............... B07C 5/3412 235/454 |
| 5,243,655 A | * | 9/1993 | Wang | ...................... G06F 3/002 235/462.09 |

* cited by examiner

*Primary Examiner* — Jamara Franklin

(57) ABSTRACT

A barcode decoding method includes steps of (a) capturing an image of a barcode; (b) analyzing the image to recognize a data region of the barcode; (c) decoding the data region to obtain a codeword matrix, wherein the codeword matrix includes a plurality of codewords; (d) performing an error correction for the codeword matrix; (e) when the codeword matrix fails to pass the error correction, repeating steps (a) to (c), updating the codeword matrix according to a number of occurrence times of each codeword at an identical position of the codeword matrix, and repeating step (d) for the codeword matrix after updating; and (f) when the codeword matrix passes the error correction, decoding the codeword matrix.

18 Claims, 7 Drawing Sheets

Codeword matrix CM1

|  | Column 1 | Column 2 | Column 3 |
|---|---|---|---|
| Row 1 | 11 | 453 | 178 |
| Row 2 | 1 | 226 | 12 |
| Row 3 | 94 | 6 | 0 |
| Row 4 | 900 | 55 | 41 |
| Row 5 | 677 | 434 | 94 |
| Row 6 | 647 | 51 | 65 |
| Row 7 | 0 | 609 | 612 |
| Row 8 | 12 | 0 | 57 |
| Row 9 | 0 | 19 | 0 |

Statistic matrix SM1

|  | Column 1 | Column 2 | Column 3 |
|---|---|---|---|
| Row 1 | 1/1/11 | 1/1/453 | 1/1/178 |
| Row 2 | 1/1/1 | 1/1/226 | 1/1/12 |
| Row 3 | 1/1/94 | 1/1/6 | 1/1/0 |
| Row 4 | 1/1/900 | 1/1/55 | 1/1/41 |
| Row 5 | 1/1/677 | 1/1/434 | 1/1/94 |
| Row 6 | 1/1/647 | 1/1/51 | 1/1/65 |
| Row 7 | 1/1/0 | 1/1/609 | 1/1/612 |
| Row 8 | 1/1/12 | 1/1/0 | 1/1/57 |
| Row 9 | 1/1/0 | 1/1/19 | 1/1/0 |

FIG. 4

Codeword matrix CM2

|  | Column 1 | Column 2 | Column 3 |
|---|---|---|---|
| Row 1 | 0 | 453 | 51 |
| Row 2 | 520 | 226 | 313 |
| Row 3 | 6 | 312 | 87 |
| Row 4 | 413 | 888 | 40 |
| Row 5 | 677 | 21 | 64 |
| Row 6 | 647 | 98 | 65 |
| Row 7 | 0 | 19 | 612 |
| Row 8 | 11 | 0 | 73 |
| Row 9 | 633 | 609 | 518 |

Statistic matrix SM2

|  | Column 1 | Column 2 | Column 3 |
|---|---|---|---|
| Row 1 | 1/1/11 1/1/0 | 2/2/453 | 1/1/178 1/1/51 |
| Row 2 | 1/1/1 1/1/520 | 2/2/226 | 1/1/12 1/1/313 |
| Row 3 | 1/1/94 1/1/6 | 1/1/6 1/1/312 | 1/1/0 1/1/87 |
| Row 4 | 1/1/900 1/1/413 | 1/1/55 1/1/888 | 1/1/41 1/1/40 |
| Row 5 | 2/2/677 | 1/1/434 1/1/21 | 1/1/94 1/1/64 |
| Row 6 | 2/2/647 | 1/1/51 1/1/98 | 2/2/65 |
| Row 7 | 2/2/0 | 1/1/609 1/1/19 | 2/2/612 |
| Row 8 | 1/1/12 1/1/11 | 2/2/0 | 1/1/57 1/1/73 |
| Row 9 | 1/1/0 1/1/633 | 1/1/19 1/1/609 | 1/1/0 1/1/518 |

Codeword matrix CM2' after updating

|  | Column 1 | Column 2 | Column 3 |
|---|---|---|---|
| Row 1 | 11 | 453 | 51 |
| Row 2 | 520 | 226 | 313 |
| Row 3 | 6 | 312 | 87 |
| Row 4 | 413 | 888 | 40 |
| Row 5 | 677 | 21 | 64 |
| Row 6 | 647 | 98 | 65 |
| Row 7 | 0 | 19 | 612 |
| Row 8 | 11 | 0 | 73 |
| Row 9 | 633 | 609 | 518 |

FIG. 5

Codeword matrix CM3

|        | Column 1 | Column 2 | Column 3 |
|--------|----------|----------|----------|
| Row 1  | 11       | 76       | 77       |
| Row 2  | 121      | 32       | 32       |
| Row 3  | 94       | 121      | 218      |
| Row 4  | 19       | 887      | 548      |
| Row 5  | 677      | 51       | 74       |
| Row 6  | 647      | 95       | 9        |
| Row 7  | 0        | 109      | 8        |
| Row 8  | 11       | 0        | 73       |
| Row 9  | 98       | 609      | 518      |

Codeword matrix CM3' after updating

|        | Column 1 | Column 2 | Column 3 |
|--------|----------|----------|----------|
| Row 1  | 11       | 453      | 77       |
| Row 2  | 121      | 226      | 32       |
| Row 3  | 94       | 121      | 218      |
| Row 4  | 19       | 887      | 548      |
| Row 5  | 677      | 51       | 74       |
| Row 6  | 647      | 95       | 65       |
| Row 7  | 0        | 109      | 612      |
| Row 8  | 11       | 0        | 73       |
| Row 9  | 98       | 609      | 518      |

Statistic matrix SM3

|        | Column 1 | Column 2 | Column 3 |
|--------|----------|----------|----------|
| Row 1  | 2/2/11 1/1/0 | 2/2/453 1/1/76 | 1/1/178 1/1/51 1/1/77 |
| Row 2  | 1/1/1 1/1/520 1/1/121 | 2/2/226 1/1/32 | 1/1/12 1/1/313 1/1/32 |
| Row 3  | 2/1/94 1/1/6 | 1/1/6 1/1/312 1/1/121 | 1/1/0 1/1/87 1/1/218 |
| Row 4  | 1/1/900 1/1/413 1/1/19 | 1/1/55 1/1/888 1/1/887 | 1/1/41 1/1/40 1/1/548 |
| Row 5  | 3/3/677  | 1/1/434 1/1/21 1/1/51 | 1/1/94 1/1/64 1/1/74 |
| Row 6  | 3/3/647  | 1/1/51 1/1/98 1/1/95 | 2/2/65 1/1/9 |
| Row 7  | 3/3/0    | 1/1/609 1/1/19 1/1/109 | 2/2/612 1/1/8 |
| Row 8  | 1/1/12 2/2/11 | 3/3/0 | 1/1/57 2/2/73 |
| Row 9  | 1/1/0 1/1/633 1/1/98 | 1/1/19 2/2/609 | 1/1/0 2/2/518 |

FIG. 6

Codeword matrix CM4

|       | Column 1 | Column 2 | Column 3 |
|-------|----------|----------|----------|
| Row 1 | 63       | 836      | 775      |
| Row 2 | 121      | 279      | 32       |
| Row 3 | 89       | 66       | 218      |
| Row 4 | 472      | 900      | 548      |
| Row 5 | 514      | 440      | 839      |
| Row 6 | 770      | 819      | 76       |
| Row 7 | 66       | 434      | 33       |
| Row 8 | 91       | 357      | 522      |
| Row 9 | 633      | 67       | 233      |

Codeword matrix CM4' after updating

|       | Column 1 | Column 2 | Column 3 |
|-------|----------|----------|----------|
| Row 1 | 11       | 453      | 775      |
| Row 2 | 121      | 226      | 32       |
| Row 3 | 94       | 66       | 218      |
| Row 4 | 472      | 900      | 548      |
| Row 5 | 677      | 440      | 839      |
| Row 6 | 647      | 819      | 65       |
| Row 7 | 66       | 434      | 612      |
| Row 8 | 11       | 357      | 73       |
| Row 9 | 633      | 609      | 518      |

Statistic matrix SM4

|       | Column 1 | Column 2 | Column 3 |
|-------|----------|----------|----------|
| Row 1 | 2/2/11<br>1/1/0<br>1/1/63 | 2/2/453<br>1/1/76<br>1/1/836 | 1/1/178<br>1/1/51<br>1/1/77<br>1/1/775 |
| Row 2 | 1/1/1<br>1/1/520<br>2/2/121 | 2/2/226<br>1/1/32<br>1/1/279 | 1/1/12<br>1/1/313<br>2/2/32 |
| Row 3 | 2/1/94<br>1/1/6<br>1/1/89 | 1/1/6<br>1/1/312<br>1/1/121<br>1/1/66 | 1/1/0<br>1/1/87<br>2/2/218 |
| Row 4 | 1/1/900<br>1/1/413<br>1/1/19<br>1/1/472 | 1/1/55<br>1/1/888<br>1/1/887<br>1/1/900 | 1/1/41<br>1/1/40<br>2/2/548 |
| Row 5 | 3/3/677<br>1/1/514 | 1/1/434<br>1/1/21<br>1/1/98<br>1/1/440 | 1/1/94<br>1/1/64<br>1/1/74<br>1/1/839 |
| Row 6 | 3/3/647<br>1/1/770 | 1/1/51<br>1/1/98<br>1/1/95<br>1/1/819 | 2/2/65<br>1/1/9<br>1/1/76 |
| Row 7 | 3/3/0<br>1/1/66 | 1/1/609<br>1/1/19<br>1/1/109<br>1/1/819 | 2/2/612<br>1/1/8<br>1/1/76 |
| Row 8 | 1/1/12<br>2/2/11<br>1/1/91 | 3/3/0<br>1/1/357 | 1/1/57<br>2/2/73<br>1/1/522 |
| Row 9 | 1/1/0<br>2/1/633<br>1/1/98 | 1/1/19<br>2/2/609<br>1/1/67 | 1/1/0<br>2/2/518<br>1/1/233 |

FIG. 7

Codeword matrix CM5

|       | Column 1 | Column 2 | Column 3 |
|-------|----------|----------|----------|
| Row 1 | 6        | 74       | 775      |
| Row 2 | 87       | 632      | 32       |
| Row 3 | 53       | 66       | 218      |
| Row 4 | 71       | 900      | 548      |
| Row 5 | 211      | 440      | 38       |
| Row 6 | 627      | 819      | 67       |
| Row 7 | 588      | 434      | 724      |
| Row 8 | 753      | 536      | 216      |
| Row 9 | 32       | 23       | 764      |

Codeword matrix CM5' after updating

|       | Column 1 | Column 2 | Column 3 |
|-------|----------|----------|----------|
| Row 1 | 11       | 453      | 775      |
| Row 2 | 121      | 226      | 32       |
| Row 3 | 94       | 66       | 218      |
| Row 4 | 71       | 900      | 548      |
| Row 5 | 677      | 440      | 38       |
| Row 6 | 647      | 819      | 65       |
| Row 7 | 588      | 434      | 612      |
| Row 8 | 11       | 536      | 73       |
| Row 9 | 633      | 609      | 518      |

Statistic matrix SM5

|       | Column 1 | Column 2 | Column 3 |
|-------|----------|----------|----------|
| Row 1 | 2/2/11<br>1/1/0<br>1/1/63<br>1/1/6 | 2/2/453<br>1/1/76<br>1/1/836<br>1/1/74 | 1/1/178<br>1/1/51<br>1/1/77<br>2/2/775 |
| Row 2 | 1/1/1<br>1/1/520<br>2/2/121<br>1/1/87 | 2/2/226<br>1/1/32<br>1/1/66<br>1/1/632 | 1/1/12<br>1/1/313<br>3/3/32 |
| Row 3 | 2/1/94<br>1/1/6<br>1/1/89<br>1/1/53 | 1/1/6<br>1/1/312<br>1/1/121<br>2/2/66 | 1/1/0<br>1/1/87<br>3/3/218 |
| Row 4 | 1/1/900<br>1/1/413<br>1/1/19<br>1/1/472<br>1/1/71 | 1/1/55<br>1/1/888<br>1/1/887<br>2/2/900 | 1/1/41<br>1/1/40<br>3/3/548 |
| Row 5 | 3/3/677<br>1/1/514<br>1/1/211 | 1/1/434<br>1/1/21<br>1/1/98<br>2/2/440 | 1/1/94<br>1/1/64<br>1/1/74<br>1/1/76<br>1/1/38 |
| Row 6 | 3/3/647<br>1/1/770<br>1/1/627 | 1/1/51<br>1/1/98<br>1/1/95<br>2/2/819 | 2/2/65<br>1/1/9<br>1/1/79<br>1/1/67 |
| Row 7 | 3/3/0<br>1/1/66<br>1/1/588 | 1/1/609<br>1/1/19<br>1/1/109<br>2/1/434 | 2/2/612<br>1/1/8<br>1/1/33<br>1/1/724 |
| Row 8 | 1/1/12<br>2/2/11<br>1/1/9<br>1/1/753 | 3/3/0<br>1/1/357<br>1/1/536 | 1/1/57<br>2/2/73<br>1/1/522<br>1/1/216 |
| Row 9 | 1/1/0<br>2/1/633<br>1/1/98<br>1/1/32 | 1/1/19<br>2/2/609<br>1/1/67<br>1/1/23 | 1/1/0<br>2/2/518<br>1/1/233<br>1/1/764 |

FIG. 8

BARCODE DECODING METHOD AND BARCODE READER

BACKGROUND OF THE INVENTION

1. Field of the Invention

The invention relates to a barcode decoding method and a barcode reader and, more particularly, to a barcode decoding method and a barcode reader capable of enhancing decoding efficiency effectively.

2. Description of the Prior Art

PDF417 is a 2D barcode, wherein PDF stands for Portable Data File. The PDF417 barcode consists of 3 to 90 rows, wherein each row comprises a start pattern, a left row indicator, a data region, a right row indicator and a stop pattern. Each codeword of the PDF417 barcode is 17 units long and consists of 4 bars and 4 spaces.

In general, the method of decoding the PDF417 barcode comprises steps of capturing an image of a barcode; performing a binarization algorithm for the image; detecting the start pattern and the stop pattern; decoding the left row indicator and the right row indicator; decoding the data region; and performing an error correction for codewords. If the codewords can pass the error correction, the codewords can be decoded by a look-up table. If the codewords fails to pass the error correction, it means that the decoding process fails and the aforesaid decoding steps have to be repeated, such that the decoding efficiency reduces.

SUMMARY OF THE INVENTION

An objective of the invention is to provide a barcode decoding method and a barcode reader capable of enhancing decoding efficiency effectively, so as to solve the aforesaid problems.

According to an embodiment of the invention, a barcode decoding method comprises steps of (a) capturing an image of a barcode; (b) analyzing the image to recognize a data region of the barcode; (c) decoding the data region to obtain a codeword matrix, wherein the codeword matrix comprises a plurality of codewords; (d) performing an error correction for the codeword matrix; (e) when the codeword matrix fails to pass the error correction, repeating steps (a) to (c), updating the codeword matrix according to a number of occurrence times of each codeword at an identical position of the codeword matrix, and repeating step (d) for the codeword matrix after updating; and (f) when the codeword matrix passes the error correction, decoding the codeword matrix.

According to another embodiment of the invention, a barcode reader comprises an image capturing unit and a processing unit, wherein the processing unit is electrically connected to the image capturing unit. The image capturing unit captures an image of a barcode. The processing unit analyzes the image to recognize a data region of the barcode. The processing unit decodes the data region to obtain a codeword matrix, wherein the codeword matrix comprises a plurality of codewords. The processing unit performs an error correction for the codeword matrix. When the codeword matrix fails to pass the error correction, the image capturing unit recaptures the image of the barcode. The processing unit analyzes the image, decodes the data region, updates the codeword matrix according to a number of occurrence times of each codeword at an identical position of the codeword matrix, and performs the error correction for the codeword matrix after updating. When the codeword matrix passes the error correction, the processing unit decodes the codeword matrix.

As mentioned in the above, when the codeword matrix fails to pass the error correction, the invention updates the codeword matrix according to the number of occurrence times of each codeword at the identical position of the codeword matrix and performs the error correction for the codeword matrix after updating, so as to improve decoding success rate. In other words, the invention accumulates the number of occurrence times of each codeword at the identical position of the codeword matrix after decoding the data region every time and selects the codeword having more occurrence times from the codewords at the identical position of the codeword matrix to update the codeword matrix. Accordingly, the invention can enhance decoding efficiency effectively.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a schematic diagram illustrating a codeword matrix and a statistic matrix obtained by first decoding process.

FIG. 5 is a schematic diagram illustrating a codeword matrix and a statistic matrix obtained by second decoding process.

FIG. 6 is a schematic diagram illustrating a codeword matrix and a statistic matrix obtained by third decoding process.

FIG. 7 is a schematic diagram illustrating a codeword matrix and a statistic matrix obtained by fourth decoding process.

FIG. 8 is a schematic diagram illustrating a codeword matrix and a statistic matrix obtained by fifth decoding process.

DETAILED DESCRIPTION

Figure 1:
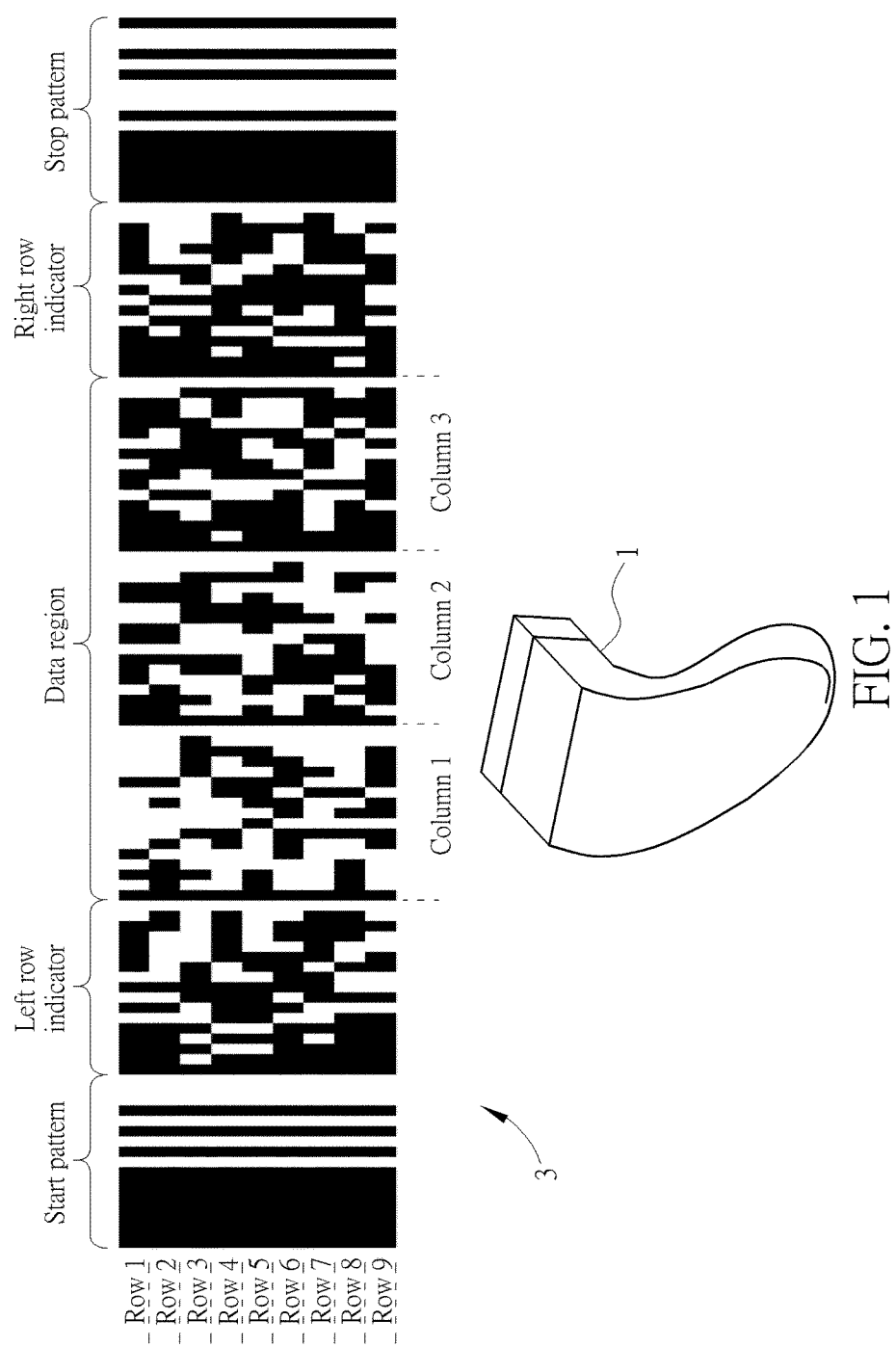
FIG. 1 is a schematic duagram illustrating a barcode reader and a barcode according to an embodiment of the invention.
Figure 2:
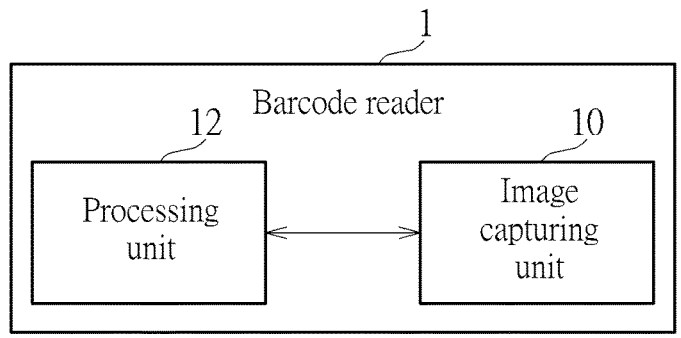
FIG. 2 is a functional block diagram illustrating the barcode reader shown in FIG. 1.
Figure 3:
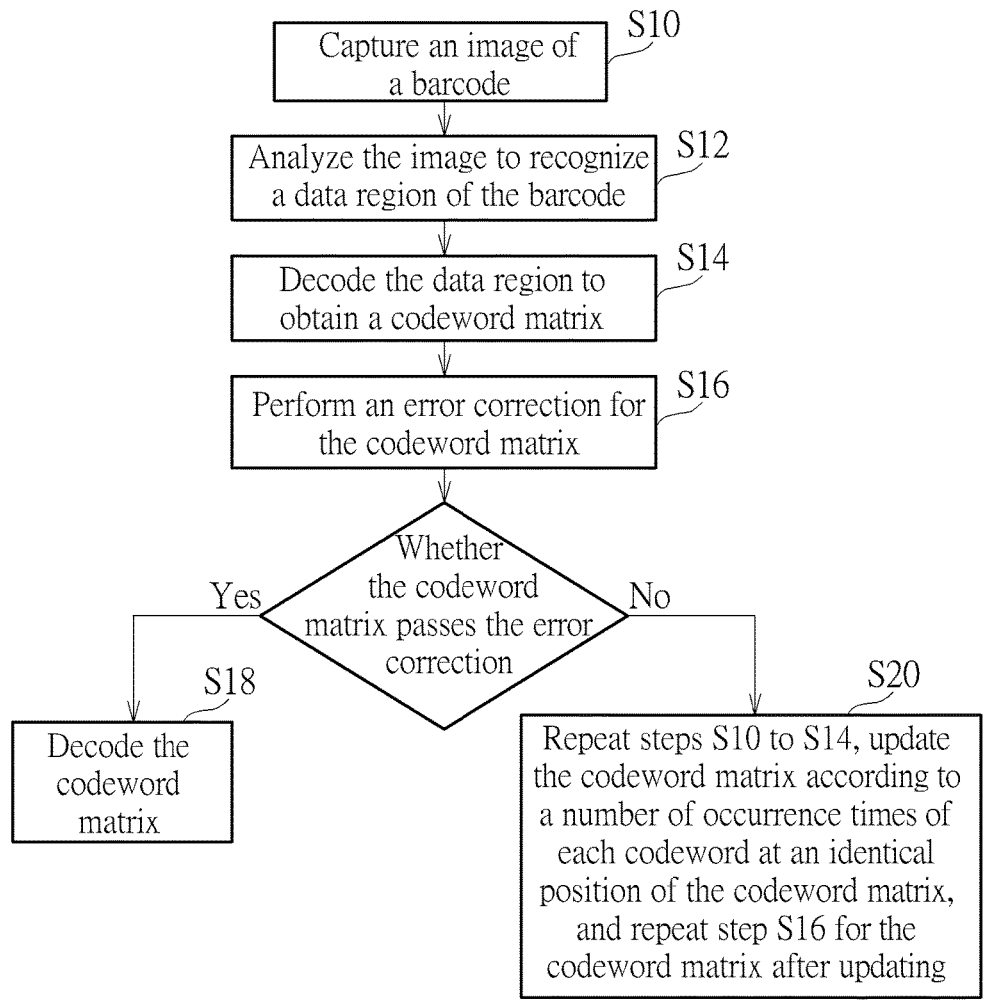
FIG. 3 is a flowchart illustrating a barcode decoding method according to an embodiment of the invention.

Referring to FIGS. 1 and 2, FIG. 1 is a schematic duagram illustrating a barcode reader 1 and a barcode 3 according to an embodiment of the invention and FIG. 2 is a functional block diagram illustrating the barcode reader 1 shown in FIG. 1.

As shown in FIG. 2, the barcode reader 1 comprises an image capturing unit 10 and a processing unit 12, wherein the processing unit 12 is electrically connected to the image capturing unit 10. In practical applications, the image capturing unit 10 may be a charge-coupled device (CCD) sensor or a complementary metal-oxide semiconductor (CMOS) sensor; the processor 12 may be a processor or a controller with data processing function. In general, the barcode reader 1 may be further equipped with some necessary hardware or software components for specific purposes, such as a memory, a circuit board, a power supply, applications, a communication module, a lens, etc., and it depends on practical applications.

As shown in FIG. 1, the barcode 3 is a PDF417 barcode, wherein the barcode 3 consists of 9 rows and each row comprises a start pattern, a left row indicator, a data region, a right row indicator and a stop pattern. Furthermore, the data region may be divided into 3 columns. The barcode reader 1 is used for reading and decoding the barcode 3.

Referring to FIGS. 3 to 8, FIG. 3 is a flowchart illustrating a barcode decoding method according to an embodiment of the invention, FIG. 4 is a schematic diagram illustrating a codeword matrix CM1 and a statistic matrix SM1 obtained by first decoding process, FIG. 5 is a schematic diagram illustrating a codeword matrix CM2 and a statistic matrix SM2 obtained by second decoding process, FIG. 6 is a schematic diagram illustrating a codeword matrix CM3 and a statistic matrix SM3 obtained by third decoding process, FIG. 7 is a schematic diagram illustrating a codeword matrix CM4 and a statistic matrix SM4 obtained by fourth decoding process, and FIG. 8 is a schematic diagram illustrating a codeword matrix CM5 and a statistic matrix SM5 obtained by fifth decoding process. The barcode decoding method shown in FIG. 3 can be implemented by the aforesaid barcode reader 1.

As shown in FIGS. 4 to 8, each position of the statistic matrices SM1-SM5 comprises three numerals represented by x/y/z, wherein x represents a number of accumulated occurrence times of the codeword, y represents a number of continuous occurrence times of the codeword, and z represents a value of the codeword. For example, in row 1/column 2 of the statistic matrix SM2 in FIG. 5, the number of accumulated occurrence times and the number of continuous occurrence times of the codeword "453" both are 2 times; in row 3/column 1 of the statistic matrix SM3 in FIG. 6, the number of accumulated occurrence times and the number of continuous occurrence times of the codeword "94" are 2 times and 1 time, respectively.

When using the barcode reader 1 to read the barcode 3, first of all, the image capturing unit 10 captures an image of the barcode (step S10). Then, the processing unit 12 analyzes the image to recognize the data region of the barcode 3 (step S12). When analyzing the image, the processing unit 12 performs a binarization algorithm for the image. Then, the processing unit detects the start pattern and the stop pattern of the barcode 3 to find out the position of the barcode 3 located in the image. Then, the processing unit 12 decodes the left row indicator and the right row indicator of the barcode 3 to obtain information including the number of rows, the number of columns, the error correction level, and so on of the barcode 3. In this embodiment, the barcode 3 may consist of 9 rows and 3 columns and the error correction level may be 3.

After recognizing the data region of the barcode 3, the processing unit 12 decodes the data region to obtain a codeword matrix (step S14), wherein the codeword matrix comprises a plurality of codewords. As shown in FIG. 4, the codeword matrix CM1 obtained after first decoding process comprises 9*3 codewords. In this embodiment, the processing unit 12 further gathers statistics for the number of occurrence times of each codeword at an identical position of the codeword matrix CM1, so as to obtain the statistic matrix SM1, wherein the number of occurrence times of the codeword may comprise the number of accumulated occurrence times and the number of continuous occurrence times mentioned in the above.

Then, the processing unit 12 performs an error correction for the codeword matrix CM1 (step S16). The error correction for the PDF417 barcode may be implemented by Reed-Solomon error correction algorithm. It should be noted that the error correction for the PDF417 barcode is well known by one skilled in the art, so it will not be depicted in detail herein.

When the codeword matrix CM1 passes the error correction, the processing unit 12 can decode the codeword matrix CM1 (step S18). In practical applications, the processing unit 12 may decode the codewords of the codeword matrix CM1 by a look-up table, so as to obtain encoded content correspondingly. It should be noted that the method of decoding the PDF417 barcode is well known by one skilled in the art, so it will not be depicted in detail herein.

When the codeword matrix CM1 fails to pass the error correction, it means that the decoding process fails. At this time, the barcode reader 1 has to repeat the aforesaid steps S10-S14 (step S20). Accordingly, when the codeword matrix CM1 fails to pass the error correction, the image capturing unit 10 has to recapture the image of the barcode 3. Then, the processing unit 12 analyzes the image and decodes the data region of the barcode 3 to obtain the codeword matrix CM2, as shown in FIG. 5. Then, the processing unit 12 gathers statistics for the number of occurrence times of each codeword at the identical position of the codeword matrices CM1-CM2, so as to obtain the statistic matrix SM2, as shown in FIG. 5.

Then, the processing unit 12 updates the codeword matrix CM2 according to the number of occurrence times of each codeword at the identical position of the codeword matrix CM2 and repeats step S16 for the codeword matrix CM2' after updating (i.e. performing the error correction for the codeword matrix CM2' after updating). When the codeword matrix CM2' after updating passes the error correction, the processing unit 12 can decode the codeword matrix CM2' after updating (step S18).

When the codeword matrix CM2' after updating fails to pass the error correction, it means that the decoding process fails. At this time, the invention has to repeat the aforesaid steps S10-S14 to obtain the codeword matrix CM3 and the statistic matrix SM3, as shown in FIG. 6. Then, the invention updates the codeword matrix CM3 and performs the error correction for the codeword matrix CM3' after updating.

When the codeword matrix CM3' after updating fails to pass the error correction, it means that the decoding process fails. At this time, the invention has to repeat the aforesaid steps S10-S14 to obtain the codeword matrix CM4 and the statistic matrix SM4, as shown in FIG. 7. Then, the invention updates the codeword matrix CM4 and performs the error correction for the codeword matrix CM4' after updating.

When the codeword matrix CM4' after updating fails to pass the error correction, it means that the decoding process fails. At this time, the invention has to repeat the aforesaid steps S10-S14 to obtain the codeword matrix CM5 and the statistic matrix SM5, as shown in FIG. 8. Then, the invention updates the codeword matrix CM5 and performs the error correction for the codeword matrix CM5' after updating.

In this embodiment, after fifth decoding process, the codeword matrix CM5' after updating can pass the error correction finally. In the prior art, the prior art performs the error correction for the codeword matrices CM1-CM5 before updating. Since the codeword matrices CM1-CM5 before updating cannot pass the error correction, the prior art has to repeat the decoding process more times to decode the barcode 3 successfully. However, the invention can decode the barcode 3 successfully after fifth decoding process, so the invention can enhance decoding efficiency effectively.

How to update the codeword matrix according to the number of occurrence times of each codeword at the identical position of the codeword matrix will be depicted in the following exemplarily.

In this embodiment, the processing unit 12 may select one codeword having more number of accumulated occurrence times or more number of continuous occurrence times from the codewords at the identical position of the codeword matrix to update the codeword matrix. For a plurality of codewords decoded from the identical position of the codeword matrix, the invention may select one codeword having more number of accumulated occurrence times to be a representative codeword because the codeword having more number of accumulated occurrence times may be correct codeword more probably in statistics. On the other hand, for a plurality of codewords decoded from the identical position of the codeword matrix, the invention may select one codeword having more number of continuous occurrence times to be a representative codeword. If a codeword having the same content has been decoded several times continuously during a period, it means that the captured image quality of the barcode may be more stable during the period. Therefore, the codeword having more number of continuous occurrence times may also be correct codeword. When a plurality of codewords having identical number of occurrence times exist at the identical position of the codeword matrix, the processing unit 12 may select one of the codewords having identical number of occurrence times according to a predetermined rule for each position to update the codeword matrix. The aforesaid predetermined rule may comprise an occurrence sequence of each codeword, a content property of each codeword, the accumulated occurrence times of each codeword, or the continuous occurrence times of each codeword.

When the aforesaid predetermined rule is the occurrence sequence of each codeword, the processing unit 12 may select one codeword occurring lately from the codewords having identical number of occurrence times at the identical position of the codeword matrix to update the codeword matrix. Needless to say, the processing unit 12 may select one codeword occurring most early from the codewords having identical number of occurrence times at the identical position of the codeword matrix to update the codeword matrix and it depends upon practical applications.

Furthermore, after the processing unit 12 decodes the data region, the content property of each codeword may comprise a non-confirmed property and a confirmed property. When the aforesaid predetermined rule is the content property of each codeword, the processing unit 12 may select one codeword having the confirmed property from the codewords having identical number of occurrence times at the identical position of the codeword matrix to update the codeword matrix. In practical applications, a codeword having the non-confirmed property may be set as "zero" and another codeword having the confirmed property may be set as "decoded non-zero value". It should be noted that how the codewords having the non-confirmed property and the confirmed property work for the error correction is well known by one skilled in the art, so it will not be depicted in detail herein.

As the statistic matrix SM2 shown in FIG. 5, the codewords "11" and "0" in row 1/column 1 have identical number of occurrence times, the codeword "11" has the confirmed property, and the codeword "0" has the non-confirmed property. Accordingly, the processing unit 12 may select the codeword "11" to update the codeword in row 1/column 1 of the codeword matrix CM2. Furthermore, the codewords "178" and "51" in row 1/column 3 have identical number of occurrence times and the codewords "178" and "51" both have the confirmed property. Accordingly, the processing unit 12 may select the codeword "51" occurring lately to update the codeword in row 1/column 3 of the codeword matrix CM2. Needless to say, the processing unit 12 may select the codeword "178" occurring most early to update the codeword in row 1/column 3 of the codeword matrix CM2.

As the statistic matrix SM3 shown in FIG. 6, the number of accumulated occurrence times of the codeword "453" in row 1/column 2 is 2 times and the number of accumulated occurrence times of the codeword "76" in row 1/column 2 is 1 time. Accordingly, the processing unit 12 may select the codeword "453" to update the codeword in row 1/column 2 of the codeword matrix CM3.

As the statistic matrix SM4 shown in FIG. 7, the number of continuous occurrence times of the codeword "0" in row 7/column 1 is 3 times and the number of continuous occurrence times of the codeword "66" in row 7/column 1 is 1 time. However, since the codeword "66" has the confirmed property and the codeword "0" has the non-confirmed property, the processing unit 12 may select the codeword "66" to update the codeword in row 7/column 1 of the codeword matrix CM4.

It should be noted that the processing unit 12 may select one codeword having one of the more number of accumulated occurrence times and the more number of continuous occurrence times from the codewords at the identical position of the codeword matrix to update the codeword matrix. When a plurality of codewords having identical number of occurrence times exist at the identical position of the codeword matrix, the aforesaid predetermined rule may be to select another codeword having another one of the more number of accumulated occurrence times and the more number of continuous occurrence times from the codewords at the identical position of the codeword matrix to update the codeword matrix.

For example, the processing unit 12 may select the codeword having more number of accumulated occurrence times to update the codeword matrix first. If two codewords A and B having identical number of accumulated occurrence times exist in a specific row/column and the codeword A has more number of continuous occurrence times, the processing unit 12 may select the codeword A to update the codeword matrix.

For example, the processing unit 12 may select the codeword having more number of continuous occurrence times to update the codeword matrix first. If two codewords C and D having identical number of continuous occurrence times exist in a specific row/column and the codeword C has more number of accumulated occurrence times, the processing unit 12 may select the codeword C to update the codeword matrix.

It should be noted that the aforesaid embodiments of the predetermined rule can be combined randomly according to practical applications to update the codeword matrix.

In another embodiment, before performing the error correction for the codeword matrix after updating, the processing unit 12 may perform the error correction for the codeword matrix before updating first. As shown in FIG. 5, before performing the error correction for the codeword matrix CM2' after updating, the processing unit 12 may perform the error correction for the codeword matrix CM2 before updating first. When the codeword matrix CM2 passes the error correction, the processing unit 12 can decode the codeword matrix CM2. When the codeword matrix CM2 fails to pass the error correction, it means that the decoding process fails. Then, the processing unit 12 performs the error correction for the codeword matrix CM2' after updating.

In another embodiment, if the codeword matrix after updating still fails to pass the error correction, the processing unit 12 may perform the error correction for the codeword matrix before updating. As shown in FIG. 5, if the codeword matrix CM2' after updating still fails to pass the error correction, the processing unit 12 may perform the error correction for the codeword matrix CM2 before updating. When the codeword matrix CM2 passes the error correction, the processing unit 12 can decode the codeword matrix CM2.

It should be noted that the control logic of the barcode decoding method of the invention can be implemented by software. Furthermore, each part or function of the control logic of the barcode decoding method of the invention may be implemented by software, hardware or the combination thereof.

As mentioned in the above, when the codeword matrix fails to pass the error correction, the invention updates the codeword matrix according to the number of occurrence times of each codeword at the identical position of the codeword matrix and performs the error correction for the codeword matrix after updating, so as to improve decoding success rate. In other words, the invention accumulates the number of occurrence times of each codeword at the identical position of the codeword matrix after decoding the data region every time and selects the codeword having more occurrence times from the codewords at the identical position of the codeword matrix to update the codeword matrix. Accordingly, the invention can enhance decoding efficiency effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A barcode decoding method comprising steps of:
   (a) capturing an image of a barcode;
   (b) analyzing the image to recognize a data region of the barcode;
   (c) decoding the data region to obtain a codeword matrix, wherein the codeword matrix comprises a plurality of codewords;
   (d) performing an error correction for the codeword matrix;
   (e) when the codeword matrix fails to pass the error correction, repeating steps (a) to (c), updating the codeword matrix according to a number of occurrence times of each codeword at an identical position of the codeword matrix, and repeating step (d) for the codeword matrix after updating; and
   (f) when the codeword matrix passes the error correction, decoding the codeword matrix.

2. The barcode decoding method of claim 1, wherein the step of updating the codeword matrix according to a number of occurrence times of each codeword at an identical position of the codeword matrix comprises step of:
   selecting one codeword having more number of accumulated occurrence times or more number of continuous occurrence times from the codewords at the identical position of the codeword matrix to update the codeword matrix.

3. The barcode decoding method of claim 2, wherein when a plurality of codewords having identical number of occurrence times exist at the identical position of the codeword matrix, the barcode decoding method further comprises step of:
   selecting one of the codewords having identical number of occurrence times according to a predetermined rule for each position to update the codeword matrix.

4. The barcode decoding method of claim 3, wherein the predetermined rule comprises an occurrence sequence of each codeword, a content property of each codeword, the accumulated occurrence times of each codeword, or the continuous occurrence times of each codeword.

5. The barcode decoding method of claim 4, wherein when the predetermined rule is the occurrence sequence of each codeword, the barcode decoding method further comprises step of:
   selecting one codeword occurring lately from the codewords having identical number of occurrence times at the identical position of the codeword matrix to update the codeword matrix.

6. The barcode decoding method of claim 4, wherein the content property of each codeword obtained by decoding the data region comprises a non-confirmed property and a confirmed property; when the predetermined rule is the content property of each codeword, the barcode decoding method further comprises step of:
   selecting one codeword having the confirmed property from the codewords having identical number of occurrence times at the identical position of the codeword matrix to update the codeword matrix.

7. The barcode decoding method of claim 4, wherein the step of updating the codeword matrix according to a number of occurrence times of each codeword at an identical position of the codeword matrix comprises steps of:
   selecting one codeword having one of the more number of accumulated occurrence times and the more number of continuous occurrence times from the codewords at the identical position of the codeword matrix to update the codeword matrix; and
   when the plurality of codewords having identical number of occurrence times exist at the identical position of the codeword matrix, the predetermined rule being to select another codeword having another one of the more number of accumulated occurrence times and the more number of continuous occurrence times from the codewords at the identical position of the codeword matrix to update the codeword matrix.

8. The barcode decoding method of claim 1, further comprising step of:
   in step (e), before repeating step (d) for the codeword matrix after updating, repeating step (d) for the codeword matrix before updating.

9. The barcode decoding method of claim 1, further comprising step of:
   in step (e), if the codeword matrix after updating still fails to pass the error correction, repeating step (d) for the codeword matrix before updating.

10. A barcode reader comprising:
    an image capturing unit capturing an image of a barcode; and
    a processing unit electrically connected to the image capturing unit, the processing unit analyzing the image to recognize a data region of the barcode, the processing unit decoding the data region to obtain a codeword matrix, the codeword matrix comprising a plurality of codewords, the processing unit performing an error correction for the codeword matrix;

wherein when the codeword matrix fails to pass the error correction, the image capturing unit recaptures the image of the barcode, the processing unit analyzes the image, decodes the data region, updates the codeword matrix according to a number of occurrence times of each codeword at an identical position of the codeword matrix, and performs the error correction for the codeword matrix after updating; when the codeword matrix passes the error correction, the processing unit decodes the codeword matrix.

11. The barcode reader of claim 10, wherein the processing unit selects one codeword having more number of accumulated occurrence times or more number of continuous occurrence times from the codewords at the identical position of the codeword matrix to update the codeword matrix.

12. The barcode reader of claim 11, wherein when a plurality of codewords having identical number of occurrence times exist at the identical position of the codeword matrix, the processing unit selects one of the codewords having identical number of occurrence times according to a predetermined rule for each position to update the codeword matrix.

13. The barcode reader of claim 12, wherein the predetermined rule comprises an occurrence sequence of each codeword, a content property of each codeword, the accumulated occurrence times of each codeword, or the continuous occurrence times of each codeword.

14. The barcode reader of claim 13, wherein when the predetermined rule is the occurrence sequence of each codeword, the processing unit selects one codeword occurring lately from the codewords having identical number of occurrence times at the identical position of the codeword matrix to update the codeword matrix.

15. The barcode reader of claim 13, wherein after the processing unit decodes the data region, the content property of each codeword comprises a non-confirmed property and a confirmed property; when the predetermined rule is the content property of each codeword, the processing unit selects one codeword having the confirmed property from the codewords having identical number of occurrence times at the identical position of the codeword matrix to update the codeword matrix.

16. The barcode reader of claim 13, wherein the processing unit selects one codeword having one of the more number of accumulated occurrence times and the more number of continuous occurrence times from the codewords at the identical position of the codeword matrix to update the codeword matrix; when the plurality of codewords having identical number of occurrence times exist at the identical position of the codeword matrix, the predetermined rule is to select another codeword having another one of the more number of accumulated occurrence times and the more number of continuous occurrence times from the codewords at the identical position of the codeword matrix to update the codeword matrix.

17. The barcode reader of claim 10, wherein before performing the error correction for the codeword matrix after updating, the processing unit performs the error correction for the codeword matrix before updating.

18. The barcode reader of claim 10, wherein if the codeword matrix after updating still fails to pass the error correction, the processing unit performs the error correction for the codeword matrix before updating.

* * * * *